(12) United States Patent
Yoshimura (10) Patent No.: US 6,252,467 B1
(45) Date of Patent: *Jun. 26, 2001

(54) VOLTAGE CONTROLLED OSCILLATOR INCLUDING A PLURALITY OF DIFFERENTIAL AMPLIFIERS

(75) Inventor: Tsutomu Yoshimura, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/360,695

(22) Filed: Jul. 26, 1999

(30) Foreign Application Priority Data

Feb. 23, 1999 (JP) .................................................. 11-044891

(51) Int. Cl.⁷ ................................. H03B 5/24; H03B 5/20
(52) U.S. Cl. ............................. 331/57; 331/34; 331/175; 331/177 R; 331/185
(58) Field of Search ...................... 331/34, 57, 175, 331/177 R, 179, 185, 186

(56) References Cited

U.S. PATENT DOCUMENTS 5,191,301 * 3/1993 Mullgrav, Jr. ........................ 331/57
5,239,274 * 8/1993 Chi ........................................ 331/57

FOREIGN PATENT DOCUMENTS 9-214299    8/1997   (JP) .

OTHER PUBLICATIONS

"A PLL Clock Generator with 5 to 110 MHz of Lock Range for Microprocessors", I. A. Young et al., IEEE Journal of Solid–State Circuits, vol. SC–27, Nov. 1992, pp. 1599–1607.

"A 0.35 μm CMOS 3–880 MHz PLL N/2 Clock Multiplier and Distribution Network with Low Jitter for Microprocessors", I. A. Young et al., 1997 IEEE International Solid–State Circuits Conference, pp. 330–331.

"Monolithic Phase–Locked Loops and Clock Recovery Circuits", B. Razavi, IEEE Press Marketing, 1996, pp. 20–21.

* cited by examiner

*Primary Examiner*—David Mis
(74) *Attorney, Agent, or Firm*—McDermott, Will & Emery (57) ABSTRACT

A differential VCO includes a ring oscillator with a plurality of differential buffers connected in a ring, a bias circuit including a replica circuit of the differential buffers, and a differential gain increasing circuit for increasing differential gain of the differential buffers. Even when the differential gain of the differential buffer lowers as a result of obtaining a clock signal of higher frequency, the ring oscillator oscillates smooth.

13 Claims, 12 Drawing Sheets

VOLTAGE CONTROLLED OSCILLATOR INCLUDING A PLURALITY OF DIFFERENTIAL AMPLIFIERS

BACKGROUND OF THE INVENTION

1. Field of the Invention

The present invention relates to a voltage controlled oscillator and, more specifically, to a voltage controlled oscillator having a frequency corresponding to a control voltage and generating a clock signal having a predetermined amplitude.

2. Description of the Background Art

Recently, as the speed of internal operation of a semiconductor integrated circuit device has been improved, a PLL (Phase Locked Loop) circuit for generating an operation clock of a higher frequency has been required. In order to implement such a PLL circuit, a voltage controlled oscillator (hereinafter referred to as VCO) operating at a high frequency is necessary.

A differential VCO using a differential buffer has been proposed as a VCO operating at a high frequency (See Japanese Patent Laying-Open No. 9-214299).

Figure 14:
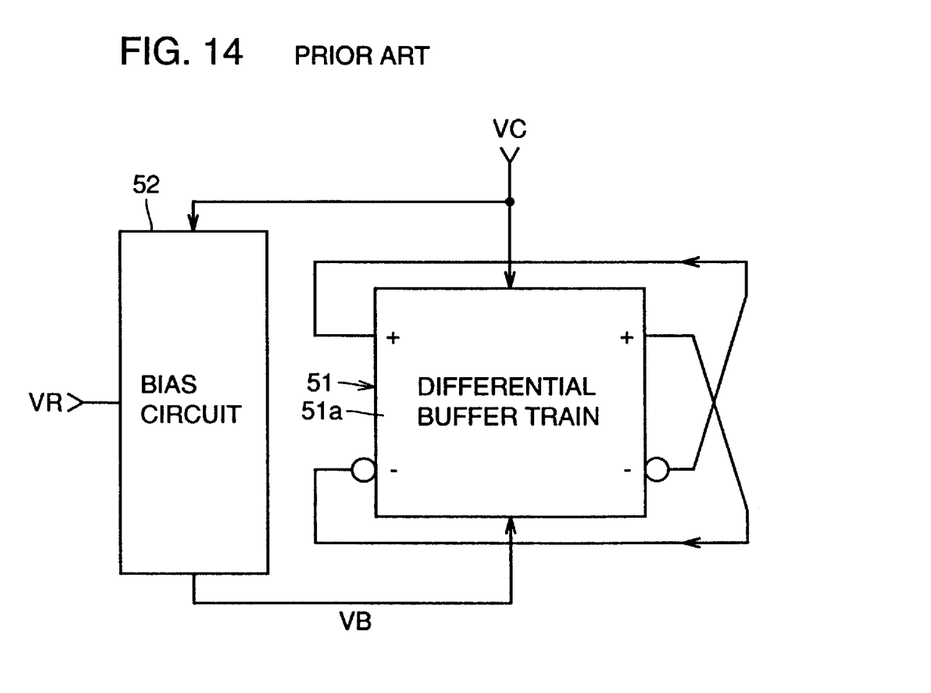
FIG. 14 is a circuit block diagram representing a configuration of a conventional differential VCO.

The differential VCO includes, as shown in FIG. 14, a ring oscillator 51 and a bias circuit 52. Ring oscillator 51 includes a differential buffer train 51a including a plurality of differential buffers connected in series. An output of the differential buffer at the last stage of differential buffer train 51a is inverted and input to the differential buffer of the first stage. Delay time of each of the differential buffers varies in accordance with the control voltage VC, and amplitude of an output clock signal from each of the differential buffers varies in accordance with a bias voltage VB. Therefore, ring oscillator 51 oscillates at a frequency in accordance with the control voltage VC and outputs a clock signal of which amplitude corresponds to the bias voltage VB.

Bias circuit 52 includes a replica circuit of the differential buffer, and generates and applies to each differential buffer a bias voltage VB so that the amplitude of the output clock signal of the differential buffer does not vary dependent on the control voltage VC but has a prescribed amplitude in accordance with the reference voltage VR.

Therefore, the differential VCO enables setting of the amplitude of the clock signal to be smaller than the power supply voltage, and hence enables generation of a clock signal at a higher frequency.

In the conventional differential VCO, however, if a clock signal of a high frequency is to be obtained, the differential buffer comes to have smaller gain, which causes difficulty in causing oscillation of ring oscillator 51.

Further, control voltage VC and bias voltage VB are adapted to vary gradually to ensure stable operation of the differential VCO, and therefore at the time of power on, for example, a certain time period is necessary until the control voltage VC and the bias voltage VB attain to the normal values. In that period, however, it is more difficult for the ring oscillator to oscillate.

SUMMARY OF THE INVENTION

Therefore, an object of the present invention is to provide a voltage controlled oscillator which facilitates oscillation.

According to an aspect, the present invention is provided with a ling oscillator including a plurality of differential amplifiers connected in a ring, a first bias circuit including a replica circuit of at least a part of the differential amplifiers, and at least one differential gain increasing circuit for increasing differential gain of at least one differential amplifier. Therefore, even when the differential amplifier comes to have smaller gain as a result of obtaining a clock signal of higher frequency, the differential gain of at least one differential amplifier is increased by the differential gain increasing circuit, and therefore, oscillation of the ring oscillator is facilitated.

Preferably, the differential amplifier includes a first differential transistor pair, a first current source causing current flow in accordance with a first bias voltage, and a first pair of variable resistance elements, control value of each of which varies in accordance with the control voltage. Thus, the differential amplifier can be formed in a simple manner.

Preferably, the differential gain increasing circuit includes a cross coupled second differential transistor pair, a second current source causing current flow in accordance with the first bias voltage, and a second pair of variable resistance elements, resistance value of each of which varies in accordance with the control voltage. Here, it is possible to provide the differential gain increasing circuit having similar structure as the differential amplifier.

Preferably, the differential gain increasing circuit includes a cross coupled second differential transistor pair, a second current source causing current flow in accordance with a second bias voltage, and a second pair of variable resistance elements the resistance value of each of which is set at a predetermined value. Further, a second bias circuit for generating the second bias voltage is provided. Here, it is possible to generate the second bias voltage regardless of the oscillating frequency, and therefore degradation of gain increasing performance of the differential gain increasing circuit is prevented.

Preferably, the differential gain increasing circuit includes a differential comparator, a first capacitor connected between an output node and an input node thereof, and a second capacitor connected between an inverted output node and an inverted input node thereof. Thus, the differential gain increasing circuit can be formed in a simple manner.

Preferably, a switch circuit for selectively connecting or disconnecting the differential gain increasing circuit to and from the corresponding differential amplifier is further provided. Here, as an unnecessary differential gain increasing circuit can be disconnected from the differential amplifier, power consumption can be reduced.

According to the further aspect, the present invention is provided with a ring oscillator including a plurality of differential amplifiers connected in a ring, a bias circuit including a replica circuit of at least a part of the differential amplifiers, and a start up circuit for controlling at least one of the control voltage and the bias voltage such that oscillation of the ring oscillator starts with ease, for only a prescribed period from an instruction to start oscillation. Therefore, even in the initial state where the control voltage and the bias voltage have not yet attained the normal values, oscillation of the ring oscillator starts smooth.

Preferably, the start up circuit includes a first switching circuit for selectively applying the control voltage or a first reference voltage for facilitating start of oscillation of the ring oscillator to a first node, and a first capacitor coupled to the first node, and delay time of each differential amplifier varies in accordance with the voltage at the first node. Here, the, first reference voltage and the control voltage can be switched easily in a smooth manner.

More preferably, the start up circuit includes a second switching circuit for selectively applying either the bias voltage or a second reference voltage for facilitating start of oscillation of the ling oscillator to a second node, and a second capacitor coupled to the second node, and the amplitude of the output clock signal of each differential amplifier varies in accordance with the voltage at the second node. Here, the second reference voltage and the bias voltage can be switched easily in a smooth manner.

Preferably, the prescribed period is from the turn on of the power supply voltage to stabilization of the power supply voltage. Here, generally, a semiconductor integrated circuit device is provided with a circuit for outputting a reset signal in the period from turning on of the power supply voltage until stabilization. Therefore, the start up circuit can be controlled in a simple manner utilizing this signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
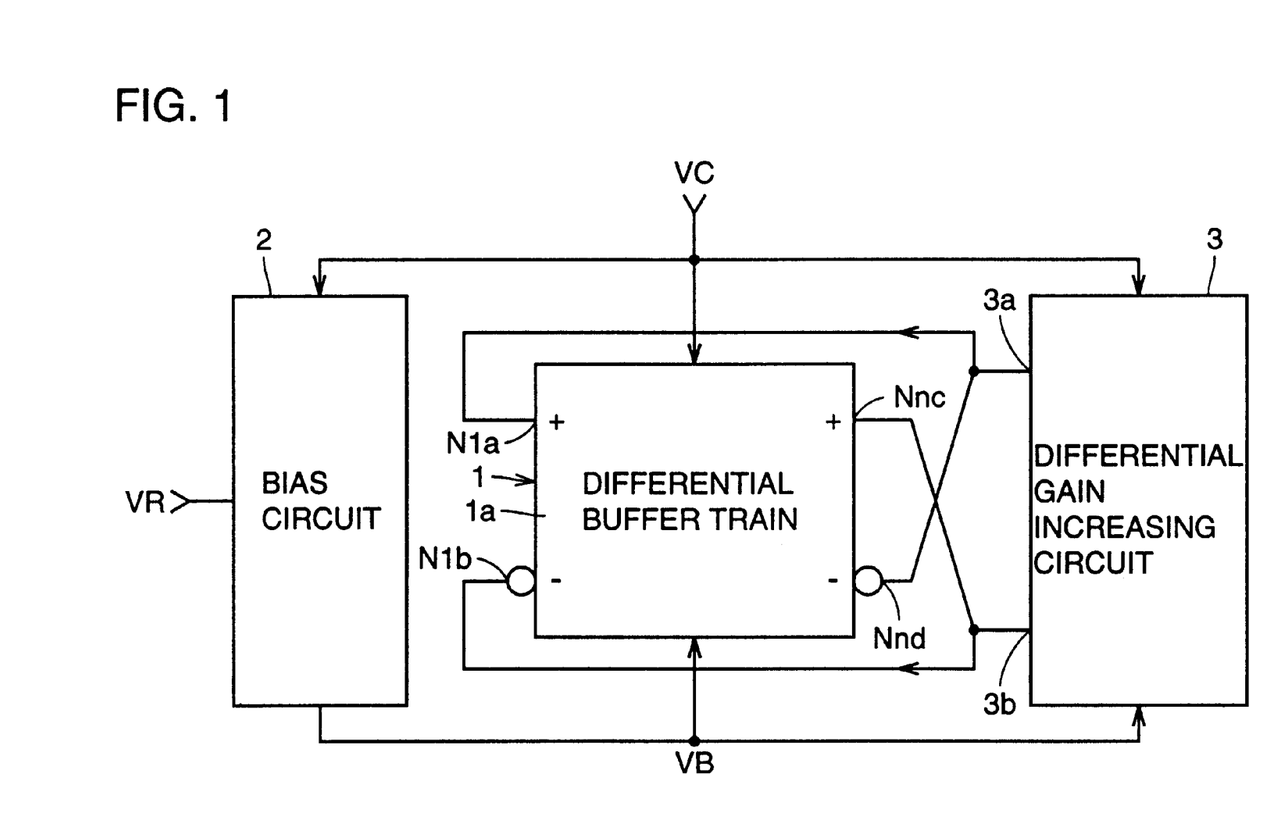
FIG. 1 is a circuit block diagram representing a configuration of a differential VCO in accordance with a first embodiment of the present invention.

FIG. 1 is a circuit block diagram representing a configuration of the differential VCO in accordance with the first embodiment of the present invention. Referring to FIG. 1, the differential VCO includes a ring oscillator 1, a bias circuit 2 and a differential gain increasing circuit 3, and ring oscillator 1 includes a differential buffer train 1a.

Figure 2:
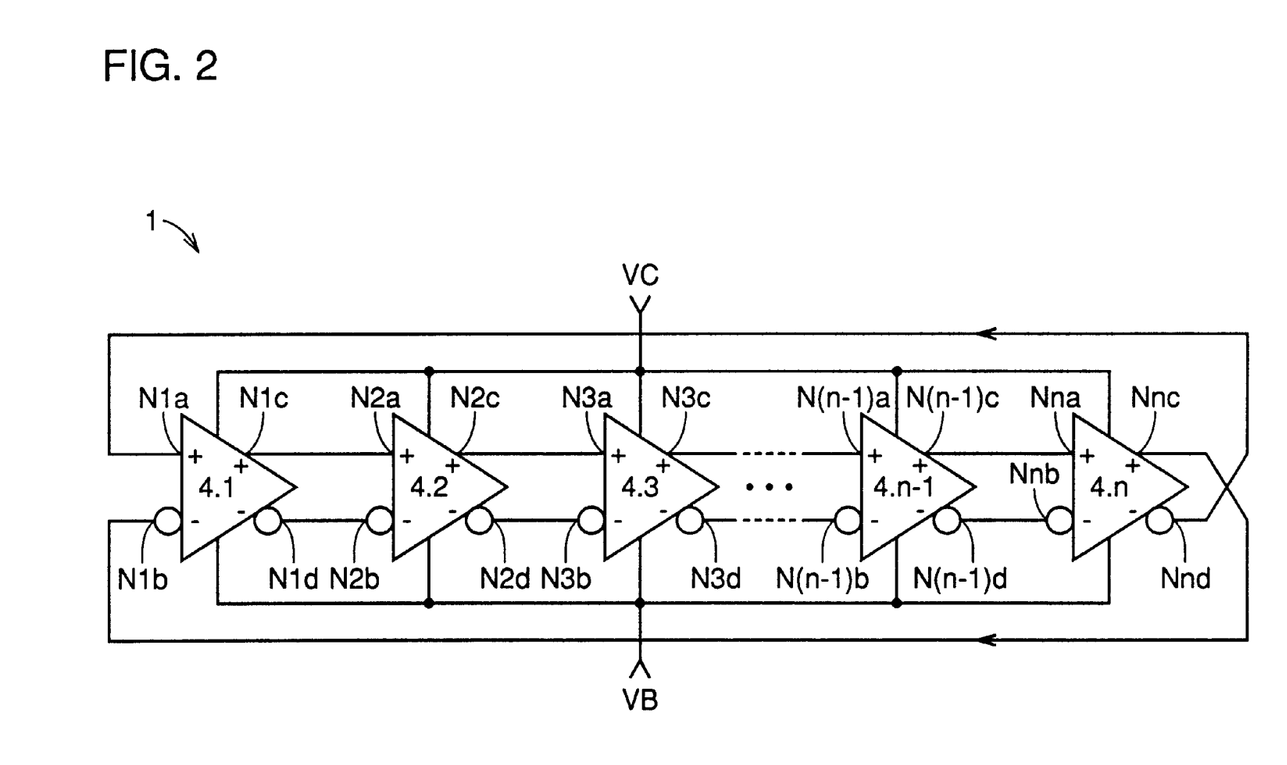
FIG. 2 is a circuit diagram representing a configuration of a ling oscillator 1 shown in FIG. 1.

Differential buffer train 1a includes n stages (n is a natural number) of differential buffers 4.1 to 4.n connected in series, as shown in FIG. 2. Outputs of respective differential buffers 4.1 to 4.n−1 are input to differential buffers 4.2 to 4.n of the succeeding stage. The output of differential buffer 4.n of the last stage is inverted and input to differential buffer 4.1 of the first stage.

Figure 3A:
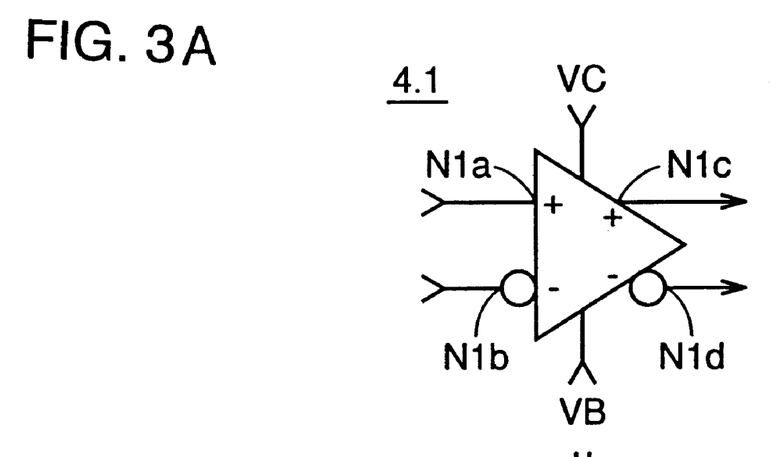
FIGS. 3A and 3B are circuit diagrams representing a configuration of a differential buffer shown in FIG. 2.
Figure 3B:
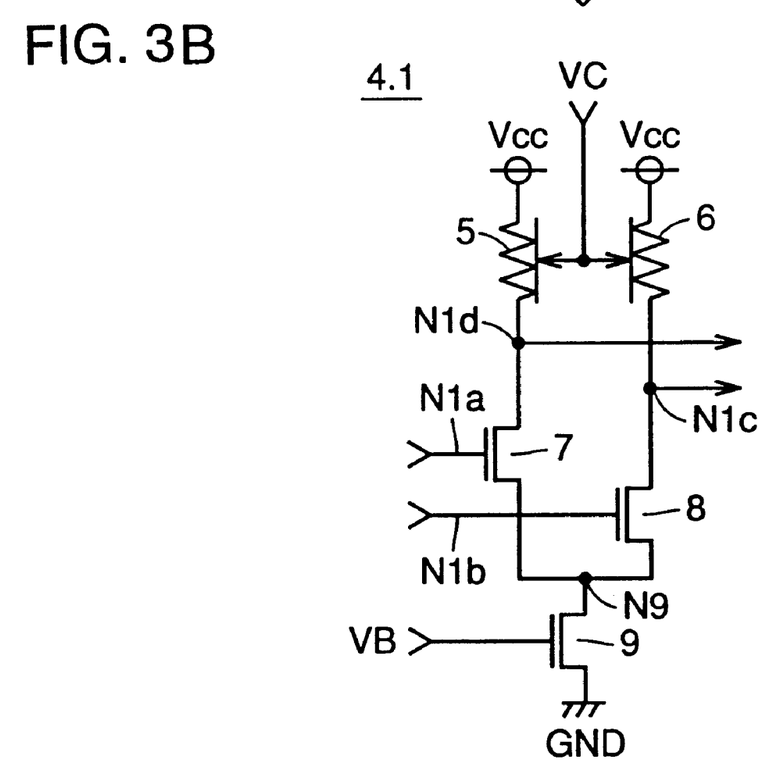

Differential buffer 4.1 includes, as can be seen from FIGS. 3A and 3B, variable resistance elements 5, 6 and N channel MOS transistors 7 to 9. Variable resistance element 5 and N channel MOS transistor 7 are connected between the line of power supply potential Vcc and a node N9, variable resistance element 6 and N channel MOS transistor 8 are connected between the line of power supply potential Vcc and node N9, and N channel MOS transistor 9 is connected between node N9 and a line of ground potential GND. The gate of N channel MOS transistor 7, the gate of N channel MOS transistor 8, the drain of N channel MOS transistor 8 and the drain of N channel MOS transistor 7 will be an input node N1a, an inverted input node N1b, an output node N1c and inverted output node N1d, of differential buffer 4.1, respectively.

Resistance values of variable resistance elements 5 and 6 vary in accordance with the control voltage VC. Each of the variable resistance elements 5 and 6 may consist of a P channel MOS transistor receiving at its gate the control voltage VC, or a parallel connection of a P channel MOS transistor and an N channel MOS transistor receiving at respective gates the control voltage VC. N channel MOS transistor 9 receives at its gate the bias voltage VB. When the potential of input node N1a attains higher than the potential of inverted input node N1b, the current value of N channel MOS transistor 7 becomes larger than the current value of N channel MOS transistor 8, and voltage drop of variable resistance element 5 becomes larger than the voltage drop of variable resistance element 6, so that the potential of output node N1c attains higher than the potential of inverted output node N1d. Conversely, when the potential of input node N1a attains lower than the potential of inverted input node N1b, the current value of N channel MOS transistor 7 becomes smaller than the current value of N channel MOS transistor 8, the voltage drop of variable resistance element 5 becomes smaller than the voltage drop of variable resistance element 6, so that the potential of output node N1c attains lower than the potential of inverted output node N1d.

The time from the transition of logic levels of input nodes N1a and N1b to the transition of logic levels of output nodes N1c and N1d, that is, the delay time of differential buffer 4.1 varies dependent on the resistance values of variable resistance elements 5 and 6, that is, dependent on the control voltage VC. When variable resistance elements 5 and 6 consist of P channel MOS transistor, and the control voltage VC attains low, the variable resistance elements 5 and 6 come to have lower resistance values, so that larger current flows to N channel MOS transistors 7 and 8, and therefore delay time becomes shorter. Conversely, when the control voltage VC attains higher, variable resistance elements 5 and 6 come to have larger resistance values, and smaller current flows to N channel MOS transistors 7 and 8, and therefore the delay time becomes longer. Remaining differential buffers 4.2 to 4.n have the same configuration as differential buffer 4.1. Therefore, ring oscillator 1 oscillates at a frequency in accordance with the control voltage VC.

Figure 4:
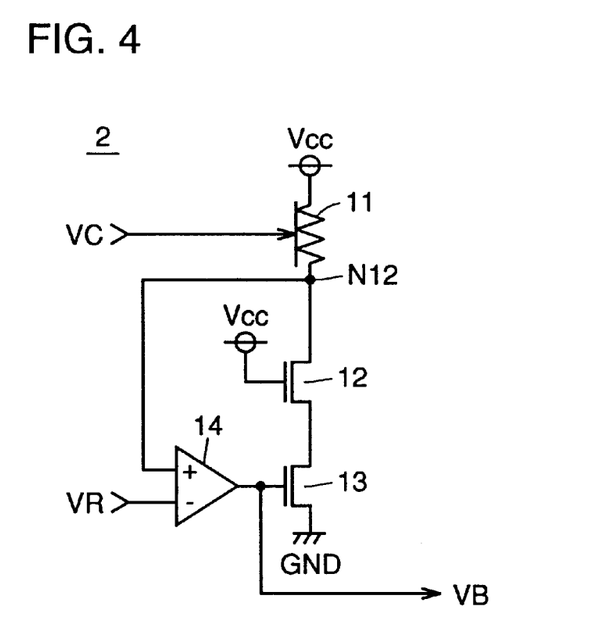
FIG. 4 is a circuit diagram representing a configuration of a bias circuit shown in FIG. 1.

Bias circuit 2 includes, as can be seen from FIG. 4, a variable resistance element 11, N channel MOS transistors 12 and 13, and an operational amplifier 14. Variable resistance element 11 and N channel MOS transistors 12 and 13 are connected in series between the line of the power supply potential Vcc and the line of the ground potential GND. The resistance value of variable resistance element 11 varies in accordance with the control voltage VC. N channel MOS transistor 12 has its gate connected to the line of the power supply potential Vcc. Therefore, N channel MOS transistor 12 is conductive. Operational amplifier 14 receives at an inverted input terminal, a reference voltage VR, has a non-inverted input terminal connected to the drain (node N12) of N channel MOS transistor 12 and its output node connected to the gate of N channel MOS transistor 13. An output of operational amplifier 14 will be the bias voltage VB, which is an output voltage of bias circuit 2. Reference potential VR represents the potential between the ground potential GND and power supply potential Vcc.

Variable resistance element 11 and N channel MOS transistors 12 and 13 are replica of variable resistance element 5 and N channel MOS transistors 7 and 9 shown in FIG. 3B. Referring to FIG. 3B, when input node N1a and inverted input node N1b attain to the "H" (high) level and "L" (low) level, respectively, no current flows to variable resistance element 6 and N channel MOS transistor 8. Therefore, in that case, differential buffer 4.1 is equivalent to variable resistance element 11 and N channel MOS transistors 12 and 13 of FIG. 4.

Operational amplifier 14 controls the gate voltage of N channel MOS transistor 13 so that node N12 attains to the reference potential VR. The output of operational amplifier 14 is input as bias voltage VB to the gate of N channel MOS transistor 9 of differential buffers 4.1 to 4.n. Therefore, the "L" level of the output clock signal from each of the differential buffers 4.1 to 4.n is at the reference potential VR, the "H" level is the power supply potential Vcc, and hence the amplitude of the clock signal is kept constant regardless of the control voltage VC.

Figure 5:
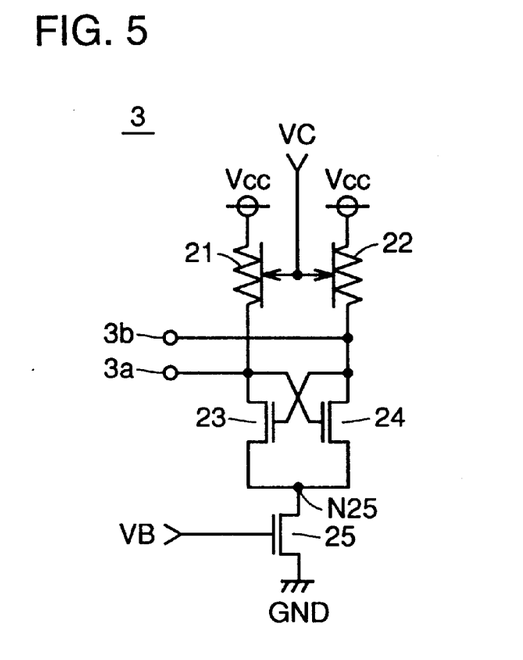
FIG. 5 is a circuit diagram representing a differential gain increasing circuit shown in FIG. 1.

Differential gain increasing circuit 3 includes, as can be seen from FIG. 5, variable resistance elements 21 and 22 and N channel MOS transistors 23 to 25. Variable resistance element 21 and N channel MOS transistor 23 are connected between the line of power supply potential Vcc and a node N25, variable resistance element 22 and N channel MOS transistor 24 are connected between the line of power supply potential Vcc and node N25, and N channel MOS transistor 25 is connected between node N25 and the line of the ground potential GND. N channel MOS transistors 23 and 24 have their gates connected to the drains of N channel MOS transistors 24 and 23, respectively, and the drains of N channel MOS transistors 23 and 24 will be the input/output nodes 3a and 3b of differential gain amplifying circuit 3, respectively. Resistance value of each of the variable resistance elements 21 and 22 varies in accordance with the control voltage VC. N channel MOS transistor 25 receives at its gate the bias voltage VB generated by bias circuit 2.

Variable resistance elements 21 and 22 and N channel MOS transistors 23 to 25 are replica of variable resistance elements 5 and 6 and N channel MOS transistors 7 to 9 shown in FIG. 3B, respectively. Therefore, the potential amplitude of input/output nodes 3a and 3b of differential gain increasing circuit 3 is kept equal to the amplitude of the output clock signal from differential buffers 4.1 to 4.n regardless of the control voltage VC.

When the potential of input/output node 3a attains slightly higher than the potential of input/output node 3b, the current value of N channel MOS transistor 23 becomes smaller than the current value of N channel MOS transistor 24, whereby the difference between input/output nodes 3a and 3b is enlarged, and hence the difference between current values of N channel MOS transistors 24 and 23 is enlarged. By the repetition of such a process, the input/output nodes 3a and 3b rapidly attain to the "H" and "L" levels, respectively.

When the potential of input/output node 3b attains slightly higher than the potential of input/output node 3a, the current value of N channel MOS transistor 24 becomes smaller than the current value of N channel MOS transistor 23, whereby the potential difference between input/output nodes 3b and 3a is enlarged and the difference in current values between N channel MOS transistors 23 and 24 is further enlarged. By the repetition of such a process, input/output nodes 3b and 3a rapidly attain to the "H" and "L" levels, respectively. Therefore, differential gain increasing circuit 3 increases the differential gain of differential buffer 4.n.

The operation of the differential VCO shown in FIGS. 1 to 5 will be briefly described in the following. The control voltage VC is externally applied to ring oscillator 1 and bias circuit 2, and reference voltage VR is applied to bias circuit 2.

Referring to FIG. 2, assume that input node N1a and inverted input node N1b of differential buffer 4.1 of the first stage attain "H" level and "L" level, respectively, at a certain time point. In that case, after the lapse of a delay time determined by the control voltage VC, input node N2a and inverted input node N2b of differential buffer 4.2 of the next stage attain to the "H" and "L" levels, respectively. The "H" and "L" level signals are propagated through differential buffers 4.3 to 4.n-1 to input node N1a and inverted input node N1b of differential buffer 4.n of the last stage. When output node Nc and inverted output node Nnd of differential buffer 4.n of the last stage attain to the "H" and "L" level, respectively, input node N1a and inverted input node N1b of differential buffer 4.1 of the first stage are inverted to "L" and "H" levels, respectively. Therefore, the clock signal generated by ring oscillator 1 has a period twice the sum of delay times of differential buffers 4.1 to 4.n. The delay time of differential buffers 4.1 to 4.n varies in accordance with the control voltage VC. Therefore, the frequency of the clock signal varies in accordance with control voltage VC.

At this time, when a small potential difference is generated between output node Nnc and inverted output node Nnd of differential buffer 4.n of the last stage, differential gain increasing circuit 3 causes a current flow in a direction further enlarging the potential difference. Accordingly, the differential gain of differential buffer 4.n is increased, facilitating oscillation of ring oscillator 1.

Further, bias voltage VB is controlled such that the amplitude of the output level of differential gain increasing circuit 3 and differential buffers 4.1 to 4.n is kept constant regardless of the control voltage VC, and hence a clock signal of a constant amplitude is obtained.

In the first embodiment, as the differential gain of differential buffer 4.n is increased by the differential gain increasing circuit 3, oscillation of ring oscillator 1 is not hindered even when the differential gain of differential buffers 4.1 to 4.n-1 lowers because of the oscillation frequency of ring oscillator 1 being set high.

Further, what is necessary is to simply arrange the differential gain increasing circuit 3 in a region adjacent to ling oscillator 1, without the necessity of changing the layout of the conventional differential VCO consisting of ring oscillator 1 and bias circuit 2. Therefore, the performance of the differential VCO can be improved in a simple manner.

A modification of the first embodiment will be described in the following. In the differential VCO shown in FIGS. 1 to 5, one differential gain increasing circuit 3 is provided in common for differential buffers 4.1 to 4.n, whereas in the modification of FIG. 6, a plurality of differential gain increasing circuits 3.1, 3.3, . . . , 3.n are provided. The input/output node pairs of differential gain increasing circuits 3.1, 3.3, . . . , 3.n are connected to the input node and the inverted input node of differential buffers 4.1, 4.3, . . . , 4.n, respectively. Here, oscillation of ring oscillator 1 is further facilitated. For simplicity of the drawing, control voltage VC and bias voltage VB are not shown in FIG. 6.

Figure 6:
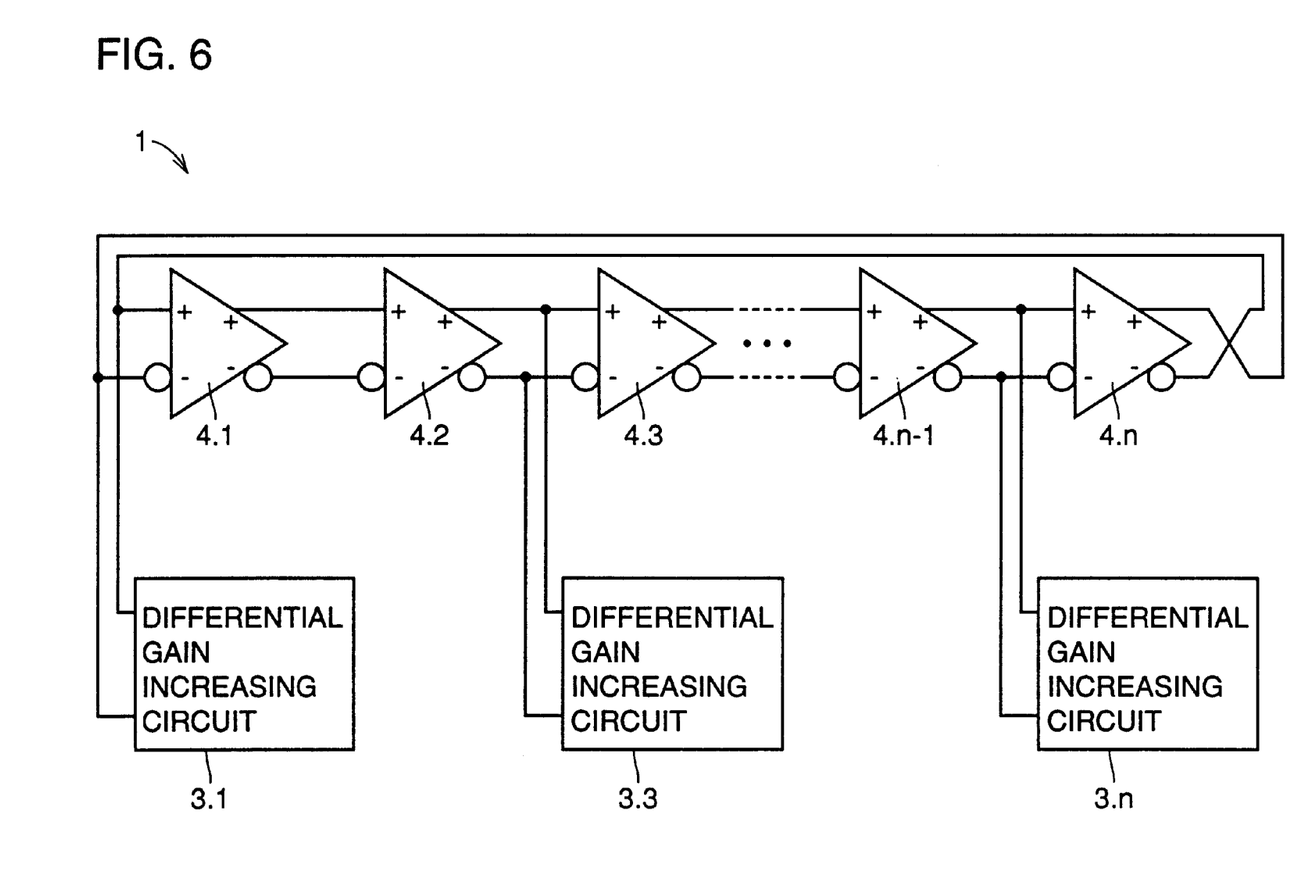
FIG. 6 is a circuit block diagram representing a modification of the first embodiment.
Figure 7:
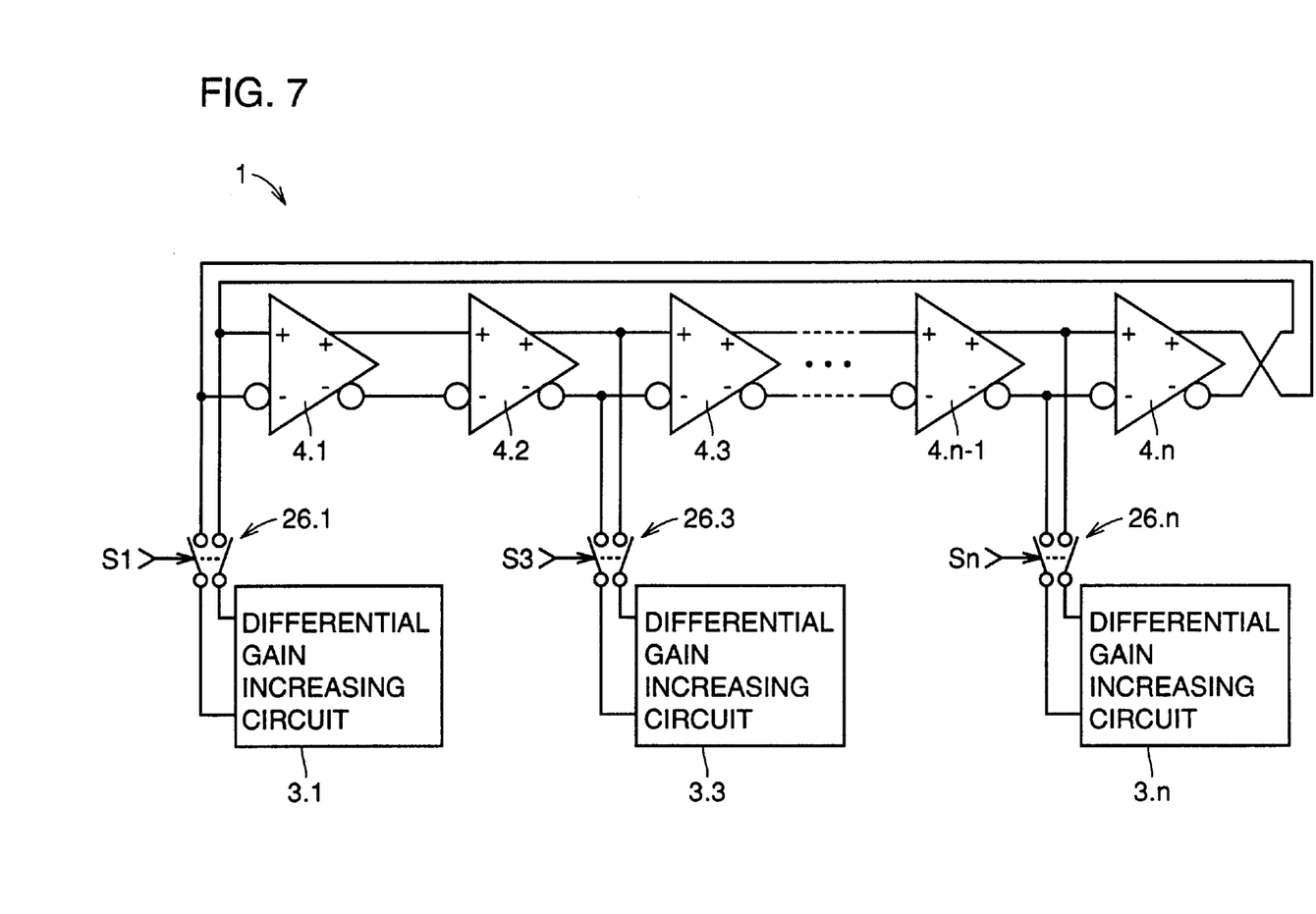
FIG. 7 is a circuit block diagram representing another modification of the first embodiment.

In the modification of FIG. 7, switches 26.1, 26.3, . . . , 26.n are further added to the modification of FIG. 6. Switches 26.1, 26.3, . . . , 26.n are connected between the two of input/output nodes of differential gain amplifying circuits 3.1, 3.3, . . . , 3.n and the input node and the inverted input node of differential buffers 4.1, 4.3, . . . , 4.n, respectively, and rendered conductive in response to selecting signals S1, S3, . . . , Sn attaining to the active level of "H". Each of the selecting signals S1, S3, . . . , Sn is activated independently. As unnecessary differential gain increasing circuit can be separated or disconnected from the differential buffer in accordance with the oscillation frequency, power consumption can be reduced.

Second Embodiment

In the differential VCO shown in FIGS. 1 to 5, when the control voltage VC is changed, the gain increasing performance of differential gain increasing circuit 3 is also changed. Particularly when the differential VCO is oscillating at a low frequency, control voltage VC attains to the high voltage and bias voltage VB attains to a low voltage, so that the current flowing through N channel MOS transistor 25 shown in FIG. 5 becomes so small that the gain increasing performance of differential gain increasing circuit 3 deteriorates.

Figure 8:
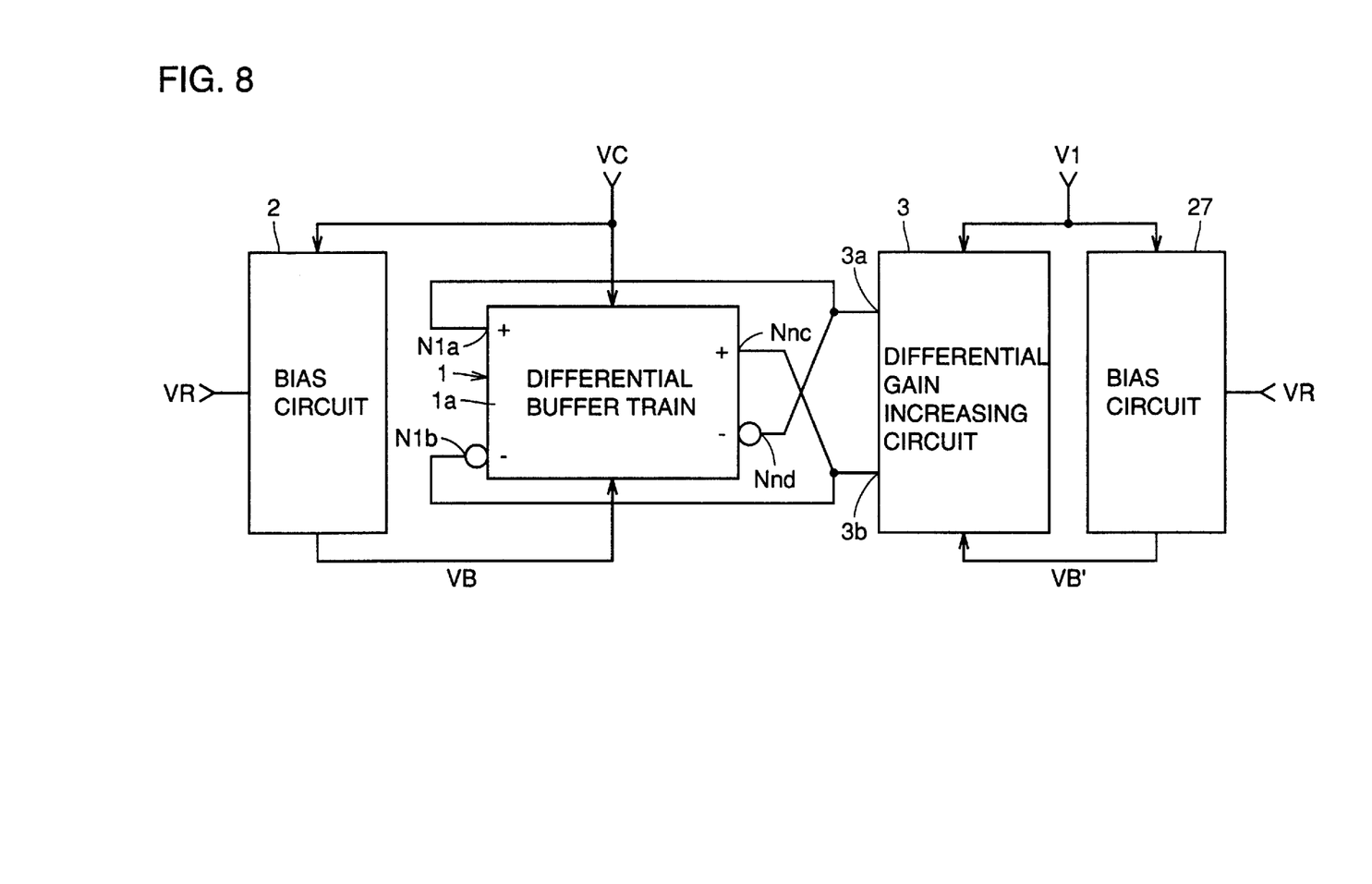
FIG. 8 is a circuit block diagram representing a configuration of a differential VCO in accordance with a second embodiment of the present invention.

Therefore, in the present embodiment, referring to FIG. 8, a bias circuit 27 for the differential gain increasing circuit 3 is provided separately. Bias circuit 27 has the same configuration as bias circuit 2. To differential gain increasing circuit 3 and bias circuit 27, a control voltage V1 which is not related to the oscillation frequency is applied in place of control voltage VC. Bias circuit 27 generates a bias voltage VB' in accordance with the control voltage V1 and reference voltage VR and applies the generated bias voltage to differential gain increasing circuit 3. Therefore, the output level amplitude of differential gain increasing circuit 3 comes to be the same as the amplitude of the output level of differential buffers 4.1 to 4.n, and hence efficiency of gain increase is independent from the oscillation frequency of the VCO.

It goes without saying that a plurality of differential gain increasing circuits 3 may be provided in the present embodiment as described with reference to FIGS. 5 and 6. In that case, one bias circuit 27 is provided commonly to the plurality of differential gain increasing circuits 3.

Third Embodiment

Figure 9:
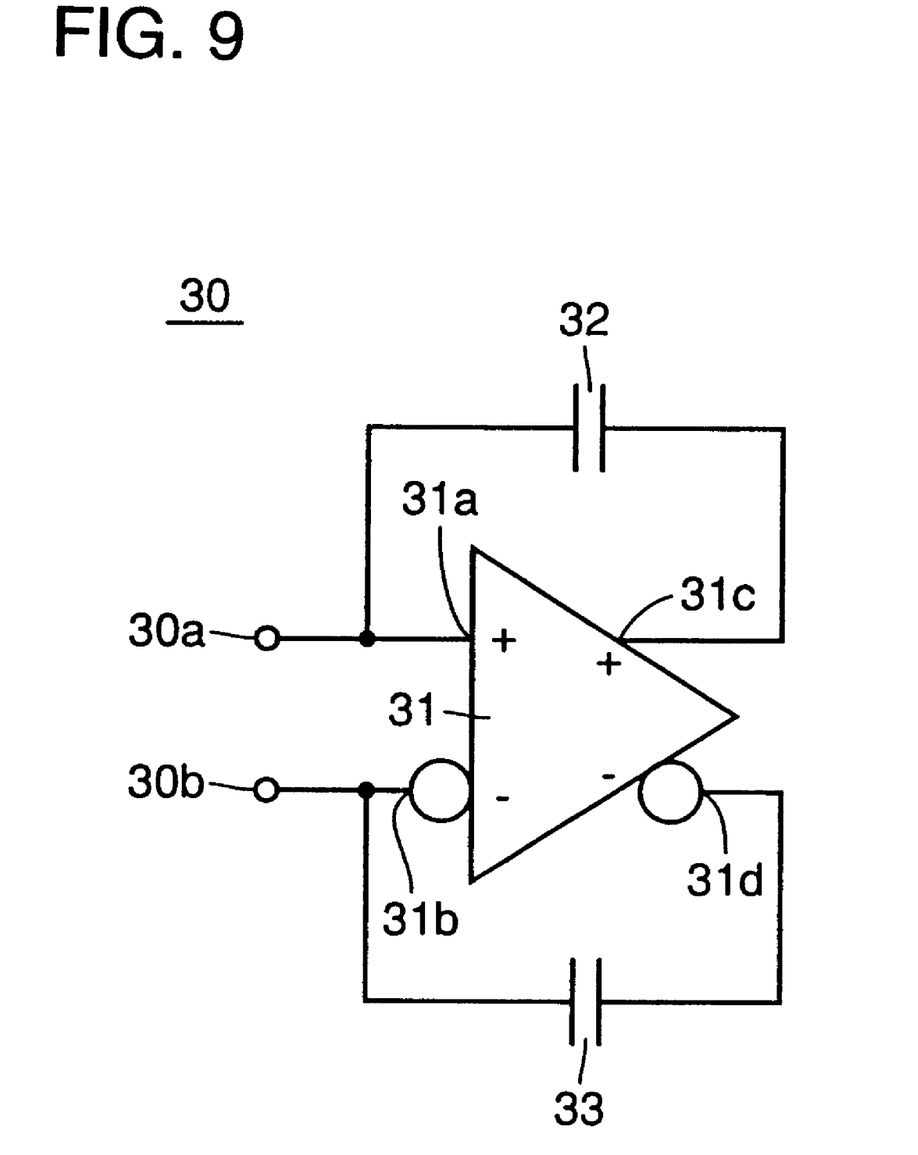
FIG. 9 is a circuit diagram representing a configuration of a differential gain increasing circuit of a differential VCO in accordance with a third embodiment of the present invention.

FIG. 9 is a circuit diagram representing a configuration of differential gain increasing circuit 30 of the differential VCO in accordance with the third embodiment of the present invention. Referring to FIG. 9, differential gain increasing circuit 30 includes a differential output comparator 31 and capacitors 32 and 33. Capacitor 32 is connected between an input node 31a and an output node 31c of comparator 31, and capacitor 33 is connected between an inverted input node 31b and an inverted output node 31d of comparator 31. Input nodes 31a and 31b of comparator 31 will be the input/output nodes 30a and 30b of differential gain increasing circuit 30. Differential gain increasing circuit 30 may be replaced by differential gain increasing circuit 3 and bias circuit 27 of FIG. 8, for example. Input/output nodes 30a and 30b of differential gain increasing circuit 30 are connected to output nodes Nnd and Nnc of differential buffer train 1a.

In differential gain increasing circuit 30, the output of comparator 31 is positively fed back to the input of comparator 31 through capacitors 32 and 33. More specifically, when the potential of input node 31a of comparator 31 attains slightly higher than the potential of inverted input node 31b, current flows in from comparator 31 to capacitor 32 to increase the potential of output node 31c, and current flows in from capacitor 33 to comparator 31 to lower the potential of inverted output node 31d. As a result, current flows through capacitor 32 to input node 31a so that the potential of input node 31a is further increased, while the charges at inverted input node 31b are drawn out through capacitor 33, so that the potential of inverted input node 31b further lowers. By the repetition of such a process, output nodes 30a and 30b rapidly attain to the "H" and "L" levels, respectively. When the potential of input node 31a of comparator 31 is slightly lower than the potential of inverted input node 31b, input/output nodes 30a and 30b rapidly attain to the "L" and "H" levels, respectively, in the similar manner.

In the present embodiment, it is not necessary to use control voltage V1 and bias voltage VB', different from the second embodiment, and therefore the configuration is simplified.

Fourth Embodiment

In the differential VCO, the differential gain becomes smaller as the oscillation frequency becomes higher. Therefore, it is possible that oscillation fails dependent on the state of the control voltage VC and bias voltage VB at the time of the start of operation. Especially, oscillation does not occur in a perfectly symmetrical system when the input and output voltages of the differential buffer attain to zero. Practically, the differential pair of the differential buffer is not perfectly symmetrical, and noise of a certain extent is continuously applied from the power supply and from the ground. Therefore, oscillation after some time lapse is expected. It is difficult to expect the starting time, however, and hence the operation remains unstable. The present embodiment addresses this problem.

Figure 10:
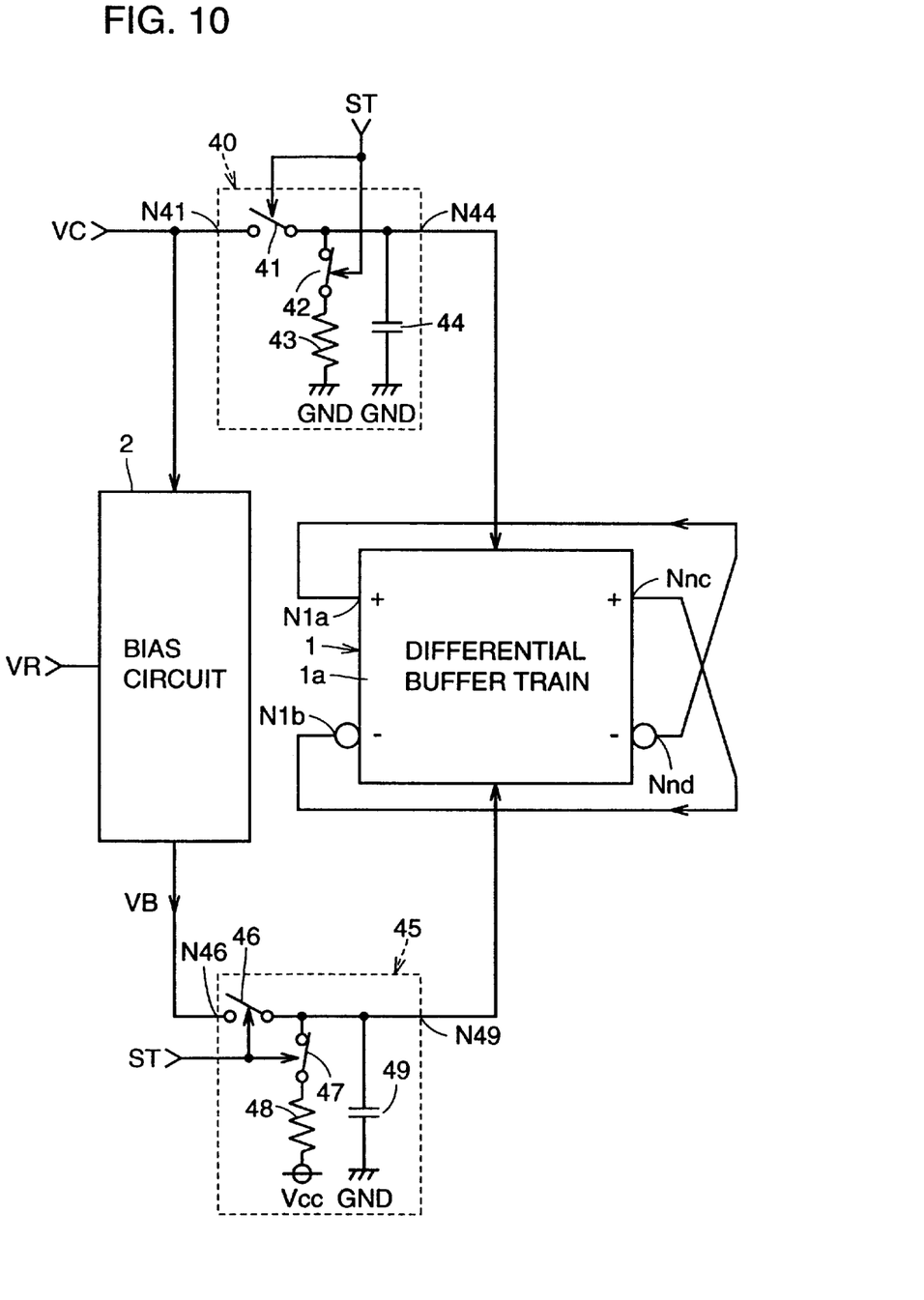
FIG. 10 is a circuit block diagram representing a configuration of a differential VCO in accordance with a fourth embodiment of the present invention.

FIG. 10 is a circuit block diagram representing a configuration of the differential VCO in accordance with the fourth embodiment. Referring to FIG. 10, the differential VCO includes a ring oscillator 1, a bias circuit 2 and start up circuits 40 and 45. Ring oscillator 1 and bias circuit 2 are the same as those described with reference to the first embodiment.

The control voltage VC is directly input to bias circuit 2 and to differential buffer train 1a through start up circuit 40. The bias voltage VB generated by bias circuit 2 is applied to differential buffer train 1a through start up circuit 45.

Start up circuit 40 includes switches 41 and 42, a resistance element 43 and a capacitor 44. Switch 41 is connected between an input node N41 and an output node N44 of start up circuit 40. Switch 42 and resistance element 43 are connected in series between output node N44 and the line of the ground potential GND, and capacitor 44 is connected between output node N44 and the line of the ground potential GND.

In a prescribed period at the start, a start up signal ST attains to the active level of "H", switch 42 is rendered conductive and switch 41 is rendered non-conductive, so that the ground potential GND is applied in place of the control voltage VC to differential buffer train 1a. Therefore, variable resistance elements 5 and 6 of each differential buffer comes to have sufficiently small resistance values.

After the lapse of the prescribed period from the start, the start up signal ST attains to the inactive level of "L", switch 41 is rendered conductive and switch 42 is rendered non-conductive, so that the potential of output node N44 changes from the ground potential GND to the control voltage VC at a time constant determined by capacitance value of capacitor 44 or the like.

Start up circuit 45 includes switches 46 and 47, a resistance element 48 and a capacitor 49. Switch 46 is connected between an input node N46 and an output node N49 of start up circuit 45. Switch 47 and resistance element 48 are connected in series between output node N49 and the line of the power supply potential Vcc, and capacitor 49 is connected between output node N49 and the line of the ground potential GND.

In a prescribed period at the start, start up signal ST attains to the active level of "H", switch 47 is rendered conductive and switch 46 is rendered non-conductive, so that the power supply potential Vcc is applied to the differential buffer train 1 in place of bias voltage VB. Accordingly, N channel MOS transistor 9 of each differential buffer comes to have sufficiently small resistance value.

After the prescribed time period from the start, start up signal ST attains to the inactive level of "L", switch 46 is rendered conductive and switch 47 is rendered non-conductive, whereby the potential of output node N49 changes from the power supply potential Vcc to the control voltage VC with the time constant determined by the capacitance value of capacitor 49 or the like.

In order to show the operation and effects of the differential VCO, simulated results of oscillating operations by the differential VCO not having the start up circuits 40 and 45 and of the differential VCO shown in FIG. 10 to which start up circuits 40 and 45 are added, will be described.

Figure 11:
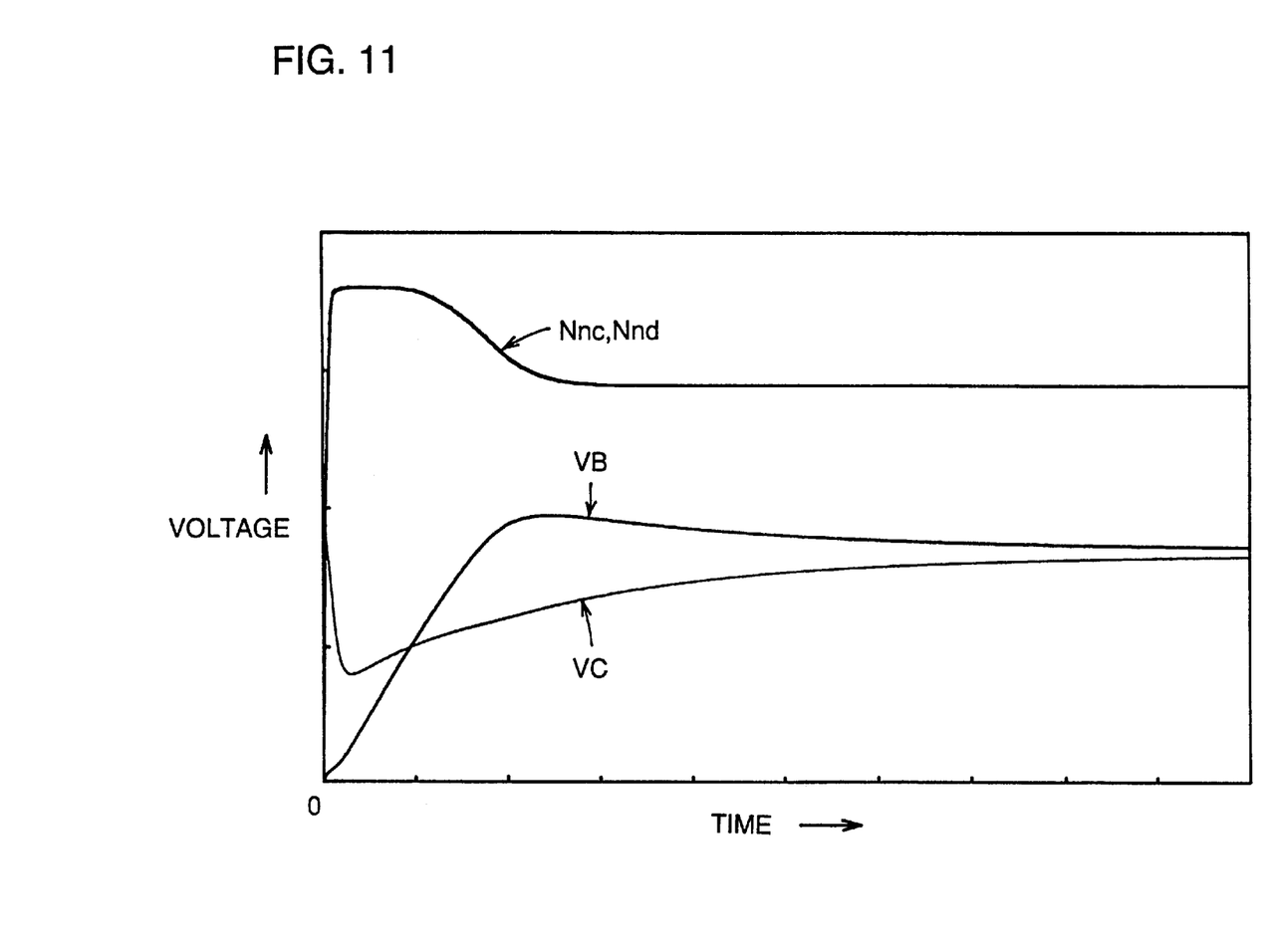
FIG. 11 is a diagram of waveforms related to the effect of the differential VCO shown in FIG. 10.

FIG. 11 is a diagram of waveforms representing the operation of the differential VCO without start up circuits 40 and 45, where the control voltage VC and the bias voltage VB are at low voltages at the time of starting.

As the control voltage VC and the bias voltage VB are low at the start, large current flows to variable resistance elements 5 and 6 of the differential buffers included in the differential buffer train 1, while hardly any current flows through N channel MOS transistor 9 (See FIG. 3). Accordingly, output nodes Nnc and Nnd of differential buffer 4.n both attain to "H" level. Though the control voltage VC and the bias voltage VB gradually attain to the normal values thereafter, ring oscillator 1 fails to oscillate, as the potential difference between output nodes Nnc and Nnd of differential buffer 4.n initially attains to 0V.

Figure 12:
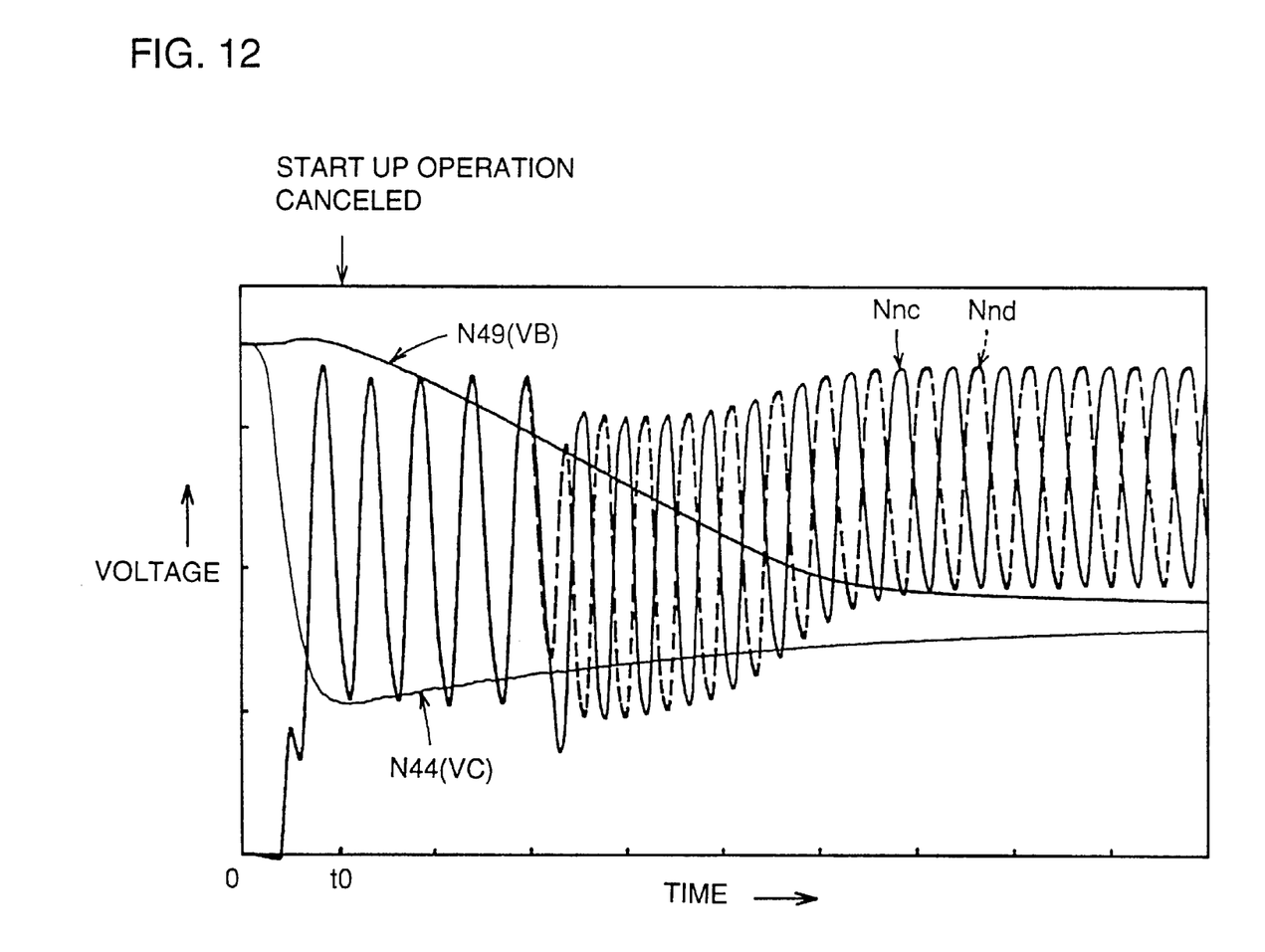
FIG. 12 is another diagram of waveforms related to the effect of the differential VCO shown in FIG. 10.

FIG. 12 is a diagram of waveforms representing the operation of the differential VCO with start up circuits 40 and 45 shown in FIG. 10. In the differential VCO, by the start up circuits 40 and 45, nodes N44 and N49 are set at a low voltage and a high voltage respectively at the time of start. In FIG. 12, in order that node N44 attains the normal voltage as quick as possible, the node N44 is set at a voltage (for example, 0.5V) higher than the ground voltage GND at the time of start, t0.

After the start up operation ends, node N44 attains from the low voltage to the control voltage VC, and node N49 attains from the high voltage to the bias voltage VB. In the initial state, the differential buffer is in a state of large driving force, and the pull up and pull down are well balanced. Therefore, the differential VCO is in a state of smooth oscillation from the start. As nodes N44 and N49 gradually attain to the normal voltages VC and VB, the differential VCO attains to the normal oscillation state, and oscillates at a desired frequency.

Figure 13:
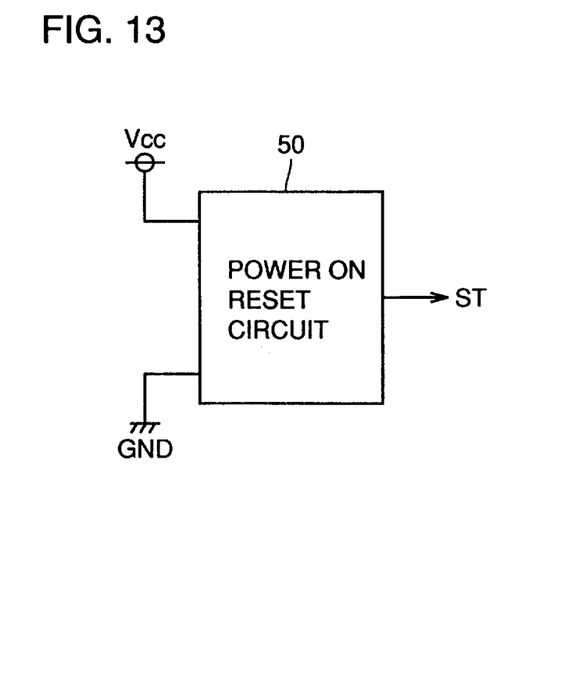
FIG. 13 is a block diagram representing a modification of the fourth embodiment.

FIG. 13 is a block diagram representing a modification of the present embodiment. In this embodiment, the start up signal ST is generated by a power on reset circuit 50. The start up signal ST attains to and kept at the active level of "H" from the turn on of the power supply until the power supply voltage is stabilized at the desired voltage, and thereafter the start up signal attains to the inactive level of "L". Here, the VCO enters the normal oscillating operation after the power supply voltage is stabilized, and therefore stable oscillating operation is ensured. Further, as power on reset circuit 50 has been conventionally provided in each semiconductor integrated circuit device, it is unnecessary to separately generate the start up signal ST.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage controlled oscillator for generating a clock signal having a frequency in accordance with a control voltage and a predetermined amplitude, comprising:
   a ring oscillator including a plurality of differential amplifiers connected in a ring, each having a delay time changing in accordance with said control voltage and an amplitude of respective output clock signal changing in accordance with a first bias voltage;
   a first bias circuit including a replica circuit of at least a part of said differential amplifiers, for generating and applying to each of the differential amplifiers said first bias voltage so that the amplitude of the output clock signal of each differential amplifier attains said predetermined amplitude; and
   at least one differential gain increasing circuit provided corresponding to at least one of said plurality of differential amplifiers for increasing differential gain of the corresponding differential amplifier.

2. The voltage controlled oscillator according to claim 1, wherein
   each differential amplifier includes
      a first pair of differential transistors having respective first electrodes connected to each other, respective input electrodes connected to a pair of input nodes, and respective electrodes connected to a pair of output nodes;
      a first current source connected between the first electrodes of said first pair of differential transistors and a line of a first power supply potential, causing current flow of a value in accordance with said first bias voltage; and
      a first pair of variable resistance elements having respective first electrodes connected to said pair of output nodes and respective second electrodes connected to a line of a second power supply potential, resistance value of each of which varies in accordance with said control voltage.

3. The voltage controlled oscillator according to claim 2, wherein said differential gain increasing circuit includes
a second pair of differential transistors having respective first electrodes connected to each other, and each having an input electrode and each having a second electrode connected to an output node pair of corresponding differential amplifier, the input electrode of each of said second pair of differential transistors connected to the second electrode of the other transistor,
a second current source connected between the first electrodes of said second pair of differential transistors and the line of said first power supply potential, causing current flow of a value in accordance with said first bias voltage, and
a second pair of variable resistance elements having respective first electrodes connected to the second electrodes of said second pair of differential transistors and respective second electrodes connected to said line of the second power supply potential, and resistance value of each of which varies in accordance with said control voltage.

4. The voltage controlled oscillator according to claim 2, wherein
said differential gain increasing circuit includes
a second pair of differential transistors having respective first electrodes connected to each other, and each having an input electrode and each having a second electrode connected to an output node pair of the corresponding differential amplifier, the input electrode of each of said second pair of differential transistors connected to the second electrode of the other transistor,
a second current source connected between the first electrodes of said second pair of differential transistors and said line of the first power supply potential and causing current flow of a value in accordance with a second bias voltage, and
a second pair of variable resistance elements having respective first electrodes connected to the second electrodes of said second pair of differential transistors, and respective second electrodes connected to the line of said second power supply potential, and resistance value of each of which is set at a predetermined value;
said voltage controlled oscillator further comprising
a second bias circuit generating said second bias voltage and applying to the second current source of said differential gain increasing circuit so that amplitude of an output clock signal of the differential amplifier corresponding to said differential gain increasing circuit has said predetermined amplitude.

5. The voltage controlled oscillator according to claim 2, wherein
said differential gain increasing circuit includes
a differential comparator having an input node and an inverted input node connected to a pair of output nodes of the corresponding differential amplifier, respectively,
a first capacitor connected between said input node and an output node of said differential comparator, and
a second capacitor connected between said inverted input node and an inverted output node of said differential comparator.

6. The voltage controlled oscillator according to claim 1, further comprising a switch circuit for selectively connecting and disconnecting said differential gain increasing circuit to and from the corresponding differential amplifier.

7. A voltage controlled oscillator, comprising:
a ring oscillator oscillating a clock signal having a frequency controlled in accordance with a first control voltage and an amplitude controlled in accordance with a first bias voltage, said ring oscillator including a plurality of differential amplifiers connected in a ring, each differential amplifier receiving the first control voltage and the first bias voltage;
a first bias voltage circuit for generating and applying to each of the differential amplifiers said first bias voltage; and
at least one differential gain increasing circuit provided corresponding to at least one of said plurality of differential amplifiers, for increasing differential gain of the corresponding differential amplifier.

8. The voltage controlled oscillator according to claim 7, wherein
each differential amplifier includes
a first pair of differential transistors having respective first electrodes connected to each other, respective input electrodes connected to a pair of input nodes, and respective electrodes connected to a pair of output nodes;
a first current source connected between the first electrodes of said first pair of differential transistors and a line of a first power supply potential, causing current flow of a value in accordance with said first bias voltage; and
a first pair of variable resistance elements having respective first electrodes connected to said pair of output nodes and respective second electrodes connected to a line of a second power supply potential, resistance value of each of which varies in accordance with said control voltage.

9. The voltage controlled oscillator according to claim 8, wherein
said differential gain increasing circuit includes
a second pair of differential transistors having respective first electrodes connected to each other, and each having an input electrode and each having a second electrode connected to an output node pair of corresponding differential amplifier, the input electrode of each of said second pair of differential transistors connected to the second electrode of the other transistor,
a second current source connected between the first electrodes of said second pair of differential transistors and the line of said first power supply potential, causing current flow of a value in accordance with said first bias voltage, and
a second pair of variable resistance elements having respective first electrodes connected to the second electrodes of said second pair of differential transistors and respective second electrodes connected to said line of the second power supply potential, and resistance value of each of which varies in accordance with said control voltage.

10. The voltage controlled to scillator according to claim 8, wherein
said differential gain increasing circuit includes
a second pair of differential transistors having respective first electrodes connected to each other, and each having an input electrode and each having a second electrode connected to an output node pair of the corresponding differential amplifier, the input electrode of each of said second pair of differential transistors connected to the second electrode of the other transistor, a second current source connected between the first electrodes of said second pair of differential transistors and said line of the first power supply potential and causing current flow of a value in accordance with a second bias voltage, and a second pair of variable resistance elements having respective first electrodes connected to the second electrodes of said second pair of differential transistors, and respective second electrodes connected to the line of said second power supply potential, and resistance value of each of which is set at a predetermined value;

said voltage controlled oscillator further comprising a second bias circuit generating said second bias voltage and applying to the second current source of said differential gain increasing circuit in accordance with a second control voltage.

11. The voltage controlled oscillator according to claim 8, wherein said differential gain increasing circuit includes a differential comparator having an input node and an inverted input node connected to a pair of output nodes of the corresponding differential amplifier, respectively, a first capacitor connected between said input node and an output node of said differential comparator, and a second capacitor connected between said inverted input node and an inverted output node of said differential comparator.

12. The voltage controlled oscillator according to claim 7, further comprising a switch circuit for selectively connecting and disconnecting said differential gain increasing circuit to and from the corresponding differential amplifier.

13. The voltage controlled oscillator according to claim 7, wherein said first bias voltage circuit generates the first bias voltage changing in accordance with the first control voltage.

* * * * *